United States Patent
Hamada et al.

(10) Patent No.: US 8,277,600 B2
(45) Date of Patent: Oct. 2, 2012

(54) HIGH-TEMPERATURE BONDING COMPOSITION, SUBSTRATE BONDING METHOD, AND 3-D SEMICONDUCTOR DEVICE

(75) Inventors: Yoshitaka Hamada, Joetsu (JP); Fujio Yagihashi, Joetsu (JP); Takeshi Asano, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 460 days.

(21) Appl. No.: 12/541,594

(22) Filed: Aug. 14, 2009

(65) Prior Publication Data
US 2010/0040895 A1 Feb. 18, 2010

(30) Foreign Application Priority Data
Aug. 15, 2008 (JP) ................. 2008-209197

(51) Int. Cl.
*C09J 7/02* (2006.01)
*B32B 9/04* (2006.01)
*C08L 83/00* (2006.01)
*C08L 83/04* (2006.01)

(52) U.S. Cl. .......... 156/329; 428/448; 524/588
(58) Field of Classification Search .......... 156/329; 428/448; 524/588
See application file for complete search history.

(56) References Cited

U.S. PATENT DOCUMENTS

| | | | |
|---|---|---|---|
| 5,844,060 A | 12/1998 | Furuya et al. | |
| 6,268,457 B1 | 7/2001 | Kennedy et al. | |
| 7,239,018 B2 | 7/2007 | Hamada et al. | |
| 2003/0091838 A1 | 5/2003 | Hayashi et al. | |
| 2004/0180222 A1 | 9/2004 | Ogihara et al. | |
| 2005/0194619 A1 | 9/2005 | Edelstein et al. | |
| 2006/0293482 A1 | 12/2006 | Rantala et al. | |
| 2007/0093078 A1 | 4/2007 | Harada et al. | |
| 2007/0255003 A1 | 11/2007 | Watanabe et al. | |
| 2008/0026322 A1 | 1/2008 | Ogihara et al. | |

FOREIGN PATENT DOCUMENTS

| | | |
|---|---|---|
| EP | 1719793 A1 | 11/2006 |
| JP | 2-180965 A | 7/1990 |
| JP | 9-071654 A | 3/1997 |
| JP | 2004-269693 A | 9/2004 |
| JP | 2006-522461 A | 9/2006 |
| JP | 2007204626 A | 8/2007 |
| JP | 2007-270125 A | 10/2007 |
| JP | 2007-314778 A | 12/2007 |
| JP | 2007-324283 A | 12/2007 |
| JP | 2008-014716 A | 1/2008 |
| JP | 2008-019423 A | 1/2008 |
| WO | 2004/059720 A1 | 7/2004 |
| WO | 2005/053009 A1 | 6/2005 |

OTHER PUBLICATIONS

European Search Report dated Nov. 10, 2009, issued in corresponding European Patent Application No. 09009945.8.

*Primary Examiner* — Michael Orlando
(74) *Attorney, Agent, or Firm* — Westerman, Hattori, Daniels & Adrian, LLP

(57) ABSTRACT

A high-temperature bonding composition comprising a silicon base polymer as a thermosetting binder is provided. The silicon base polymer is obtained from dehydrolytic condensation of a condensate precursor comprising a silane compound having at least one pair of silicon atoms tied by a crosslink composed of an aliphatic hydrocarbon, heterocyclic or aromatic hydrocarbon group, and having at least three hydroxyl and/or hydrolyzable groups. Those silicon atoms having a direct bond to the crosslink composed of the aliphatic hydrocarbon, heterocyclic or aromatic hydrocarbon group are present in a proportion of at least 90 mol % relative to all silicon atoms in the polymer.

2 Claims, No Drawings

HIGH-TEMPERATURE BONDING COMPOSITION, SUBSTRATE BONDING METHOD, AND 3-D SEMICONDUCTOR DEVICE

CROSS-REFERENCE TO RELATED APPLICATION

This non-provisional application claims priority under 35 U.S.C. §119(a) on Patent Application No. 2008-209197 filed in Japan on Aug. 15, 2008, the entire contents of which are hereby incorporated by reference.

TECHNICAL FIELD

This invention relates to a high-temperature bonding composition which is resistant at high temperatures of about 400° C. so that it may be suited for bonding of substrates, and a method of bonding substrates together using the same, especially for use in vertically stacked semiconductor devices. It also relates to a three-dimensional semiconductor device.

BACKGROUND ART

While the large-scale integrated circuit (LSI) technology seeks for higher performances, typically to accelerate the data processing speed and to increase the data processing throughput, a number of technologies including lithography have been developed to enable fabrication of finer feature size structures. The sequence of size reduction is known as Moore's law. In the lithography technology, for example, the use of ArF excimer laser exposure has already succeeded in commercial fabrication of 65-nm node devices, and using the immersion lithography, further miniaturization has already been scheduled. However, a possibility is pointed out that a limit will be imposed on the enhancement of performance relying solely on miniaturization, not only from the lithography technology, but also from the technical or material aspect.

Another approach for achieving higher integration density or higher processing speed is to stack LSIs vertically to increase the density of integration or processing speed. This three-dimensional (3D) semiconductor integrated circuit has attracted attention as the technology capable of increasing the density of integration or processing speed independent of the miniaturization of cell structure, and a number of research works have already been made in the art.

The methods of stacking LSIs vertically include a method of joining LSI-bearing wafers together to form a stack, a method of attaching LSI chips on a LSI-bearing wafer to form a stack, and a method of attaching LSI chips one on top of another to form a stack. In these methods, joining LSI chips together is one of key technologies, and the joint is required to be defect-free and rigid.

Joining of LSI chips together may be either direct or indirect joining. The direct method is to join bond surfaces directly, and known as silicon fusion bonding or ion plasma bonding. The direct joining method can generally form a joint of high strength, which does not contain any unnecessary third material in principle, and thus has the advantage of high reliability. On the other hand, the method encounters a high technical hurdle because the bond surfaces are required to have a high flatness and a minimal surface roughness to enable bond formation. In addition, the method is not applicable to ragged surfaces where circuits have already been formed.

Among the indirect methods, the mounting technique of joining chips to form a stack has been commercially utilized, though within a limited range. For example, JP-A 2007-270125 discloses an insulating sheet of thermosetting resin which is used for forming a joint between chips so that a plurality of chips may be stacked.

As an example of forming a joint between wafers, WO 2004059720 (JP-A 2006-522461) discloses a process including building devices on wafers, thinning the wafers, bonding the device-built-in wafers with an insulating material, and forming electrical interconnections between the stacked wafers. The insulating material used is a polyimide material.

It is well known that silicone materials at room temperature have good adhesion to various substrates, and especially excellent adhesion to glass ($SiO_2$) and metals. Silicone rubber has a flexible structure and thermal shock resistance, is effective in bonding metal and/or glass members having different coefficients of thermal expansion, and is used typically as sealant. Silicone rubber is improved in heat resistance by incorporating phenyl or similar groups so that it may be used at relatively high temperatures, but the temperature limit is about 300° C. The reason is that the dialkylsiloxane moiety which is a main constituent of silicone rubber is subject to thermal isomerization into a dialkyl cyclic which is decomposed and scattered away. On the other hand, siloxane or silica resins obtained through dehydrolytic condensation of tri- or tetra-functional hydrolyzable silanes free of a dialkylsiloxane moiety such as trialkoxysilanes and tetraalkoxysilanes do not undergo thermal decomposition or degradation, but have a rigid and brittle structure so that cracks readily occur if the coefficient of thermal expansion differs between the resin and the substrate. These resins are thus difficult to form a satisfactory film by thermosetting.

In conjunction with 3D semiconductor devices and 3D sensors as mentioned above, a manufacturing process including joining substrates via a bond layer and then processing the substrate assembly is contemplated in order to enable fabrication of more complex devices. Nevertheless, the manufacturing process may include treatment at high temperatures of 400° C. or higher, for example, CVD step. If the substrate assembly having a plurality of substrates joined through a bond layer is treated at such high temperatures of 400° C. or higher, most organic bonding agents lose their bond strength. There is thus a desire to have a bonding agent having a low modulus of elasticity and resistance to high temperatures.

Although bonding agents or adhesives having satisfactory high-temperature resistance so that they may be used at or above 1000° C. are limited to inorganic ones, some bonding agents to be used at high temperatures in the range of 400° C. to 500° C. contain an organic silicone compound as one component. For example, JP-A H02-180965 discloses an adhesive agent for use around an exhaust gas conduit from an engine, which comprises a silicone compound as a component capable of binding the main adhesive component, inorganic material. JP-A 2008-14716 describes an inorganic sodium silicate-based adhesive agent as the heat resistant adhesive agent for optical fibers, wherein upon heating, stresses are applied to the fibers to give rise to an accident that cracks form, but such stresses may be mitigated by adding polymethylsilsesquioxane particles having a particle size of 2 μm. These adhesive agents take advantage of the high-temperature resistance of Si—O—Si linkage of polysiloxane materials although they cannot be a precise bonding agent to be used in the interior of semiconductor devices.

However, as discussed in JP-A 2008-14716, inorganic adhesive agents having good high-temperature resistance have so high a hardness that a problem arises when thermal stresses are applied, and are difficult to use in semiconductor and similar systems where the presence of sodium and potassium ions should be avoided. The approach for stress mitigation using macroscopic particles is hesitatingly employed in the application where the adhesive is used as a thin film or a high flatness is required during coating.

When the silicone compounds containing many divalent silicon atoms (which refer to a silicon atom having bonds to two oxygen atoms) as described in JP-A H02-180965 are used in an environment which will reach temperatures as high as 400° C., disproportionation reaction occurs in some siloxane moieties to form cyclic siloxanes which are liberated. Then, if such a material is used as the main component of the bond layer, an accident occurs that the bond strength is gradually lost or the gas liberated can interfere with the function of semiconductor.

The above and other patent documents, which are incorporated herein by reference, are listed below.

CITATION LIST

Patent Document 1: JP-A 2007-270125
Patent Document 2: WO 2004059720 (JP-A 2006-522461)
Patent Document 3: JP-A H02-180965
Patent Document 4: JP-A 2008-14716
Patent Document 5: JP-A 2008-19423
Patent Document 6: WO 2005053009
Patent Document 7: JP-A 2004-269693
Patent Document 8: JP-A 2007-324283
Patent Document 9: JP-A 2007-314778
Patent Document 10: U.S. Pat. No. 6,268,457
Patent Document 11: JP-A H09-71654

SUMMARY OF INVENTION

An object of the invention is to provide a high-temperature bonding composition which can be used as a bond layer within a precise structure, experiences a minimal weight loss when components bonded therewith are processed at high temperatures, and maintains a strong bond against thermal stresses. Another object is to provide a method for bonding substrates using the same and a 3D semiconductor device using the same.

If ordinary materials are used in the applications where the above requirements are imposed, a trade-off problem occurs between the respective requirements. Specifically, to achieve the effect of mitigating thermal stresses without resorting to the macroscopic mechanical effect as disclosed in JP-A 2008-14716, a material having a low modulus of elasticity must be used. On the other hand, to reduce a weight loss on heating, source materials must be selected such as to form a silicon-based polymer in which silicon atoms may have a relatively high crosslinking density as a result of thermally stable crosslinkage upon curing. If an attempt is made to achieve a high crosslinking density using an ordinary material, the resulting material generally has so high a modulus of elasticity that the thermal stress mitigating effect may be lost.

Making numerous trial-and-error experiments to solve the above problems, the inventors have found that when a hydrolyzable silane compound having a plurality of silicon atoms tied by a carbon chain is used as a main source material for a silicon-based polymer, a bond layer formed of the resulting silicon-based polymer, after curing, experiences a minimal weight loss on heating, and yet has a low modulus of elasticity enough to gain the desired thermal stress mitigating effect. Alternatively, a choice is made of a material having such properties that after a bond layer precursor coating thereof is cured, the cured film experiences a weight loss of up to 3% when heated at 400° C. for 60 minutes and has a modulus of elasticity of up to 4 GPa. In either case, a semiconductor device or sensor comprising the material as a bond layer within the device is reliable in that few damages are induced by heat shocks encountered in subsequent steps.

In one aspect (Claim 1), the invention provides a high-temperature bonding composition comprising a silicon base polymer as a thermosetting binder. The silicon base polymer is obtained from dehydrolytic condensation of a condensate precursor or a mixture of condensate precursors. The condensate precursor comprises a silane compound having at least one pair of silicon atoms tied by a crosslink composed of an optionally cyclic structure-containing straight or branched, or cyclic aliphatic hydrocarbon group of 1 to 10 carbon atoms, a heterocycle-containing group of 4 or 8 carbon atoms, or an aromatic ring-containing hydrocarbon group of 6 to 12 carbon atoms, the silane compound having at least three hydroxyl groups and/or hydrolyzable groups. Those silicon atoms having a direct bond to the crosslink composed of the aliphatic hydrocarbon group, the heterocycle-containing group or the aromatic ring-containing hydrocarbon group are present in a proportion of at least 90 mol % relative to all silicon atoms in the silicon base polymer.

When the silicon base polymer in which at least 90 mol % of silicon atoms have at least one crosslink by a bond with carbon is prepared from the silicon compound specified above and used as the thermosetting binder, a high-temperature bonding composition is provided which meets the requirement of heat resistance at high temperatures and the requirement of resistance to heat shocks at the same time.

In a preferred embodiment (Claim 2), those silicon atoms having a direct bond to the crosslink composed of the aliphatic hydrocarbon group, the heterocycle-containing group or the aromatic ring-containing hydrocarbon group in the silicon base polymer have the structure of the general formula (1):

$$Q_p SiR_{4-p-q} X_q \tag{1}$$

wherein p is an integer of 1 to 4, q is an integer of 0 to 2, $2 \leq p+q \leq 4$, Q is each independently a di- to pentavalent crosslinking group composed of the aliphatic hydrocarbon group, the heterocycle-containing group or the aromatic ring-containing hydrocarbon group, X is each independently hydrogen, hydroxyl, alkoxy of 1 to 4 carbon atoms, or a bond to an oxygen atom bonding with another silicon atom, and R is an optionally substituted, aliphatic or aromatic ring-containing monovalent hydrocarbon group of 1 to 12 carbon atoms.

In a preferred embodiment (Claim 3), the number of silicon atoms satisfying $p+q \geq 3$ in formula (1) is at least 70 mol % of the total number of silicon atoms included in formula (1). By so designing the crosslinking density of silicon atoms in the silicon base polymer, satisfactory heat resistance at or above 400° C. is expectable.

In an embodiment (Claim 4), preferred examples of the silane compound having at least one pair of silicon atoms tied by a crosslink and having at least three hydroxyl groups and/or hydrolyzable groups include silane compounds of the general formulae (2), (3) and (4):

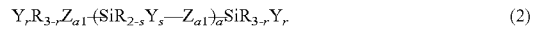
$$Y_r R_{3-r} Z_{a1}-(SiR_{2-s}Y_s-Z_{a1})_{\overline{a}} SiR_{3-r} Y_r \tag{2}$$

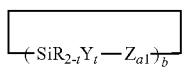 (3)

$$Y_rR_{3-r}Si-Z_x-(SiR_{3-r}Y_r)_c \qquad (4)$$

wherein a is an integer of 1 to 20, r is each independently an integer of 1 to 3, s is an integer of 0 to 2, with the proviso that when all r's are 1, all s's are not equal to 0, b is an integer of 2 to 6, t is an integer of 0 to 2, not all t's being equal to 0, c is an integer of 1 to 4, with the proviso that when c is 1, all r's are not equal to 1, R is as defined in formula (1), Y is each independently hydrogen, hydroxyl or alkoxy of 1 to 4 carbon atoms, Za1 is a divalent, optionally cyclic structure-containing straight or branched, or cyclic aliphatic hydrocarbon group of 1 to 10 carbon atoms which may be substituted, and Zx is an optionally cyclic structure-containing straight or branched, or cyclic aliphatic hydrocarbon group of 1 to 10 carbon atoms or an aromatic ring-containing hydrocarbon group of 6 to 12 carbon atoms.

In a preferred embodiment (Claim 5), in formulae (2) to (4), at least one r is equal to or greater than 2 (r≧2), at least one s is equal to or greater than 1 (s≧1), and at least one t is equal to or greater than 1 (t≧1). When these silane compounds are used, the resultant bond layer is expectable to have satisfactory heat resistance at or above 400° C.

In another aspect (Claim 6), the invention provides a method of bonding substrates, comprising the steps of applying the high-temperature bonding composition defined above to a substrate to form a bond layer precursor coating, joining another substrate to the substrate so as to sandwich the bond layer precursor coating therebetween, and heat curing the bond layer precursor coating to bond the substrates together. By applying the bonding composition to one or both of substrates to be joined, bringing them in contact under pressure, and heating, a bond layer is formed between the substrates. The resulting bond layer has satisfactory heat resistance at high temperatures of the order of 400° C. and a low modulus of elasticity. Thus, the bonding force is not lost even when the substrates as bonded are exposed to high temperatures, and bond failures by heat shocks are avoided.

In a further aspect (Claim 7), the invention provides a method of bonding substrates together via a bond layer precursor coating formed from a silicon base polymeric material, wherein the bond layer precursor coating is free of particles having a particle size of at least 1 μm and able to cure at a temperature of up to 400° C. into a cured film having a modulus of elasticity of up to 4 GPa, the cured film experiencing a weight loss of up to 3% when heated at 400° C. and held at 400° C. for 60 minutes. In the embodiment (Claim 8) wherein substrates are bonded together using a bonding composition capable of forming such a cured film, especially the high-temperature bonding composition, the occurrence of bond failure and other problems is suppressed even when the bonded substrates are subject to a CVD or similar step which involves exposure to high temperatures of about 400° C.

In a typical embodiment (Claim 9), the substrates to be bonded by the inventive bonding method are used in the manufacture of semiconductor devices. In fabricating a three-dimensional stack of semiconductor devices, any intermediate assembly as bonded can be subsequently processed without concerns about bond failures by heat shocks or other thermal factors. Then the design of the fabricating process is given a high degree of freedom. Since the bond layer of the silicon base polymer material may be processed by dry etching under the same conditions as silicon substrates, the method is also advantageous when holes are formed for providing interconnections between bonded substrates in the stack.

A still further aspect of the invention (Claim 10) is a 3-D semiconductor device fabricated using the bonding method described above. Since a bond layer having high thermal stability and resistance to heat shocks is produced by the bonding method, the resultant 3-D semiconductor device is highly reliable.

ADVANTAGEOUS EFFECT OF INVENTION

The high-temperature bonding composition of the invention may be used to form a bond layer within a precise structure. Even when the substrates bonded therewith are subsequently processed at high temperatures, the bond layer experiences a minimal weight loss and maintains a sound bond despite thermal stresses being applied.

DESCRIPTION OF EMBODIMENTS

Bonding agents or adhesives follow a variety of bonding mechanisms. In one bonding method capable of achieving a high bond strength, a polymeric material in a bond layer precursor coating behaves such that in the curing step, crosslinks form between polymeric molecules to complete a bond. In the case of well-known silicone base bonding agents, for example, once a bond layer precursor coating is provided between substrates to be bonded, condensation or addition reaction is allowed to occur between a side chain on the silicone resin and a crosslinker in the precursor coating sandwiched between the substrates, thereby curing the precursor coating to complete a bond layer.

As is known in the art, polysiloxanes obtained from dehydrolytic condensation of hydrolyzable silane compounds having a functionality of at least 3 (equivalent to at least 3 hydrolyzable groups) such as methyltrimethoxysilane are used as spin-on-glass (SOG) material. When a coating film formed from the polysiloxane is sintered, the film cures through the mechanism that a Si—O—Si crosslink forms between polymeric molecules. The resulting SOG film has heat stability enough to withstand treatment at high temperatures of about 400° C., as is well known from the previous studies for the exploitation of SOG films in semiconductor fabrication.

The inventors consider these materials to be attractive materials having a basic function as the high-temperature bonding agent, as opposed to the organic polymers as disclosed in JP-A H02-180965 (Patent Document 3) and the complex systems containing inorganic macroscopic particles as disclosed in JP-A 2008-14716 (Patent Document 4), and without extra use of a crosslinker as in general silicone adhesives.

On the other hand, in order to function as a bonding agent, the materials must have such a low modulus of elasticity that the bond interface or bond layer may not fail even when thermal stresses are applied to the bond layer due to a difference in coefficient of thermal expansion between substrates bonded together or between one of substrates bonded together and the bond layer. Where such physical properties as typified by a low modulus of elasticity are necessary, a process is commonly employed involving using a difunctional hydrolyzable silane as the main raw material for polymers, adding a fraction of a tri- or polyfunctional hydrolyzable silane to promote cure, and effecting co-dehydrolytic condensation. If cure promotion is achieved as in JP-A 2008-

19423 (Patent Document 5), a film resulting from a siloxane derivative may be cured at temperatures below 200° C. By contrast, when a polysiloxane compound is obtained by using a difunctional hydrolyzable silane as the raw material in an amount of about 80 mol % (% of silicon based on the entire hydrolyzable silane mixture as the raw material), adding a tri- or tetrafunctional hydrolyzable silane thereto, and effecting co-dehydrolytic condensation, a film of this polysiloxane compound has a substantially low modulus of elasticity as compared with the SOG film. Yet, when this cured film was heated above 300° C., an apparent weight loss was observed. It is believed that this weight loss occurs because disproportionation reaction of siloxane bonds takes place in consecutive difunctional siloxane units under high-temperature conditions to produce cyclic oligomers which are liberated in gas form.

Then the inventors continued studies on the method of forming a film having both heat resistance and a low modulus of elasticity, using silicon base polymers. The inventors have found that when a silicon base polymer is obtained from dehydrolytic condensation of a condensate precursor or a mixture of condensate precursors, the condensate precursor comprising a silane compound which has at least one pair of silicon atoms tied by a crosslink composed of an optionally cyclic structure-containing, straight or branched aliphatic hydrocarbon group of 1 to 10 carbon atoms, a cyclic aliphatic hydrocarbon group of 1 to 10 carbon atoms, a heterocycle-containing group of 4 or 8 carbon atoms, or an aromatic ring-containing hydrocarbon group of 6 to 12 carbon atoms, and which has at least three hydroxyl groups and/or hydrolyzable groups, so that those silicon atoms having a direct bond to the crosslink composed of the aliphatic hydrocarbon group, heterocycle-containing group or aromatic ring-containing hydrocarbon group are present in a proportion of at least 90 mol % relative to all silicon atoms in the silicon base polymer, this silicon base polymer may be used as a thermosetting binder to formulate a high-temperature bonding composition which forms a bond layer capable of meeting both the requirements of high heat resistance and low modulus of elasticity which are otherwise in tradeoff relation.

The silane compound having hydroxyl groups and/or hydrolyzable groups is generally referred to as "hydrolyzable silane compound" even when it contains hydroxyl groups. When a silane compound having at least three hydroxyl groups and/or hydrolyzable groups is used, there is obtained a silicon base polymer which is heat cured by the mechanism that when sintered, crosslinks form between polymeric molecules.

At least 90 mol % of silicon atoms in the silicon base polymer are silicon atoms having a direct bond to the crosslink composed of the aliphatic hydrocarbon group, heterocycle-containing group or aromatic ring-containing hydrocarbon group. Differently stated, the main chain or crosslinked chain that at least 90 mol % of silicon atoms in the silicon base polymer possess necessarily contains a crosslink composed of hydrocarbon group or heterocycle-containing group.

Although not wishing to be bound by theory, the inventors believe that the thermosetting binder in the bonding composition of the invention forms a bond layer characterized by high heat resistance and a low modulus of elasticity for the following reason.

In a film obtained by sintering the silicon base polymer, the main chain or crosslinked chain that at least 90 mol % of silicon atoms in the silicon base polymer possess necessarily contains a crosslink composed of hydrocarbon group or heterocycle-containing group. The film is free of a linear (di-alkyl-substituted Si)—O-(dialkyl-substituted Si) continuous chain susceptible to disproportionation as found when a large proportion of a difunctional hydrolyzable silane is used merely for the purpose of reducing a modulus of elasticity. This accounts for improved heat resistance. The total amount of carbon crosslinks and oxygen crosslinks provides a sufficient crosslinking density, which ensures a minimal probability that a gasifiable material forms when partial cleavage by heat temporarily occurs. Since at least one of valence bonds of a silicon atom which are used to form crosslinks with other silicon atoms is a Si—C bond having a small orbital interaction and a long bond distance as compared with a Si—O bond, this crosslink has a high degree of freedom as compared with a Si—O—Si crosslink and serves to reduce a modulus of elasticity.

In conjunction with the definition of the silane compound having hydroxyl groups and/or hydrolyzable groups, the silane compound having at least one pair of silicon atoms may include a silane compound having two silicon atoms, so-called binuclear silane compound, in which the hydrocarbon chain crosslink is between two silicon atoms; and a trinuclear silane compound in which three silicon atoms are arranged in a straight chain array with two hydrocarbon crosslinks interposed therebetween, or silicon atoms bond to both ends of a hydrocarbon crosslink and another silicon atom bonds to a carbon atom positioned intermediate the crosslink chain, or in which three or more silicon atoms are tied by crosslinks, for example, a silicon atom is bonded to the intermediately positioned carbon atom via an alkylene group. It is also acceptable that three silicon atoms are bonded to a cyclic hydrocarbon skeleton, meaning that silicon and carbon crosslinks may be alternately arranged to form a ring. Also included are tetra- or polynuclear silane compounds in which four silicon groups may be arranged such that all are positioned at ends or some are positioned intermediate of the chain as mentioned above.

In connection with the crosslink bonded to a silicon atom in the silane compound having hydroxyl groups and/or hydrolyzable groups, examples of the optionally cyclic structure-containing, straight or branched aliphatic hydrocarbon group of 1 to 10 carbon atoms that forms the crosslink include divalent groups, for example, alkylene and alkenylene groups, such as methylene, ethylene, propylene, butene, pentene, hexene, heptene, octene, nonene, decene, and isomers thereof. Examples of the cyclic aliphatic hydrocarbon group of 1 to 10 carbon atoms that forms the crosslink include di- to tetravalent cyclopentane, cyclohexane, and norbornane rings, and derivatives thereof in which a silicon atom may be bonded to the ring structure via an alkylene group.

The cyclic aliphatic hydrocarbon groups may also be polycyclic groups such as norbornane and adamantane rings. In the case of polycyclic structure, interposition of at least one methylene group between a silicon atom and the cyclic structure is preferred for the purpose of reducing a modulus of elasticity. Exemplary of the heterocycle-containing group are groups having a tetrahydrofuran or tetrahydropyran ring structure.

Exemplary of the aromatic ring-containing hydrocarbon group (sometimes referred to simply as aromatic hydrocarbon group) are groups having a benzene, naphthalene or anthracene ring structure. In the case of aromatic hydrocarbon group, an aromatic ring having a silicon atom directly bonded thereto is advantageous in order to design the polymer so as to have enhanced thermal stability, and interposition of at least one methylene group between a silicon atom and the ring is preferred in order to reduce a modulus of elasticity, with interposition of at least two methylene groups being preferred when thermal stability is also taken into account.

Among the above exemplified groups, a choice of aliphatic hydrocarbon groups excluding polycyclic ones is most preferred in that a good balance of thermal stability and a low modulus of elasticity is readily achievable.

In a preferred embodiment, those silicon atoms having a direct bond to the crosslink composed of the aliphatic hydrocarbon group, the heterocycle-containing group or the aromatic ring-containing hydrocarbon group which are present in a proportion of at least 90 mol % relative to all silicon atoms in the silicon base polymer have the structure of the general formula (1):

$$Q_p SiR_{4-p-q} X_q \quad (1)$$

wherein p is an integer of 1 to 4, q is an integer of 0 to 2, $2 \leq p+q \leq 4$, Q is each independently a di- to pentavalent, preferably di- or trivalent, and most preferably divalent, crosslinking group composed of the aliphatic hydrocarbon group, the heterocycle-containing group or the aromatic ring-containing hydrocarbon group, X is each independently hydrogen, hydroxyl, alkoxy of 1 to 4 carbon atoms, or a bond to an oxygen atom bonding with another silicon atom, and R is an optionally substituted, aliphatic or aromatic ring-containing monovalent hydrocarbon group of 1 to 12 carbon atoms.

In formula (1), R is an optionally substituted, aliphatic or aromatic ring-containing monovalent hydrocarbon group of 1 to 12 carbon atoms. If R is a straight aliphatic group having relatively many carbon atoms, it is effective in reducing the modulus of elasticity of a sintered film to some extent, but not to a significant extent. From the standpoint of thermal stability, non-branched single chain groups such as methyl are advantageous. However, since decomposition of a side chain itself has no significant impact on adhesion, a relatively free choice of the relevant group gives rise to no problem. Groups preferred for a good balance of material availability and thermal stability include methyl, ethyl, propyl, butyl, pentyl, hexyl, cyclopentyl, cyclohexyl and phenyl, though not limited thereto as mentioned above.

In formula (1), p+q=3 or 4 means that the silicon atom forms at least three crosslinks (including main chain) in the silicon base polymer after sintering or has such a forming ability. Then, even when cleavage of a bond by high temperature occurs in proximity to the silicon atom having such structure, a possibility that a gasifiable compound having a low molecular weight forms is minimized. Accordingly, when the number of silicon atoms satisfying $p+q \geq 3$ in formula (1) is at least 70 mol % of the total number of silicon atoms included in formula (1) in the silicon base polymer, the weight loss of the bond layer on heating at high temperatures of 400° C. or above is minimized. Thus the bond layer not only has satisfactory resistance to high temperatures, but also when used in semiconductor bonding, prevents the occurrence of function failures in the bonded device to a substantial extent.

In a preferred embodiment, the silane compound having at least one pair of silicon atoms tied by a crosslink and having at least three hydroxyl groups and/or hydrolyzable groups includes structures of the general formulae (2), (3) and (4).

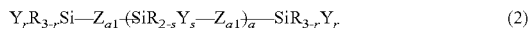
$$Y_r R_{3-r} Si - Z_{a1} - (SiR_{2-s} Y_s - Z_{a1})_a - SiR_{3-r} Y_r \quad (2)$$

$$(3)$$

$$Y_r R_{3-r} Si - Z_x - (SiR_{3-r} Y_r)_c \quad (4)$$

Herein a is an integer of 1 to 20, r is each independently an integer of 1 to 3, s is an integer of 0 to 2, with the proviso that when all r's are 1, all s's are not equal to 0, b is an integer of 2 to 6, t is an integer of 0 to 2, not all t's being equal to 0, c is an integer of 1 to 4, with the proviso that when c is 1, all r's are not equal to 1; R is as defined in formula (1); Za1 is a divalent, optionally cyclic structure-containing straight or branched, or cyclic aliphatic hydrocarbon group of 1 to 10 carbon atoms which may be substituted; Zx is an optionally cyclic structure-containing straight or branched, or cyclic (c+1)-valent aliphatic hydrocarbon group of 1 to 10 carbon atoms or an aromatic ring-containing hydrocarbon group of 6 to 12 carbon atoms; and Y is each independently hydrogen, hydroxyl or alkoxy of 1 to 4 carbon atoms.

By effecting dehydrolytic condensation of these silane compounds, silicon atoms having a direct bond to the crosslink composed of the aliphatic hydrocarbon group, the heterocycle-containing group or the aromatic ring-containing hydrocarbon group can be introduced in the resulting silicon base polymer. By effecting condensation of a hydrolyzable silane alone or a mixture of hydrolyzable silanes in which all silicon atoms have hydrocarbon crosslinks and bonds, a silicon base polymer in which all silicon atoms have a direct bond to the hydrocarbon crosslink is obtainable. Where the hydrolyzable silane is used in admixture with another hydrolyzable silane or silane having silanol groups if desired, the mixing ratio is adjusted such that at least 90 mol % of silicon atoms in the resulting silicon base polymer are silicon atoms having a direct bond to the crosslink composed of the aliphatic hydrocarbon group, the heterocycle-containing group or the aromatic ring-containing hydrocarbon group.

In formulae (1) and (2), the aliphatic hydrocarbon groups represented by Za1 include numerous groups, preferably chain-like groups such as methylene, ethylene, propylene, butene, pentene, hexene and isomers thereof; and cyclic groups such as cyclopentane and cyclohexane rings and crosslinking groups in the form of a cyclopentane or cyclohexane ring which is bondable to a silicon atom via a methylene chain. Those preferred groups selected as Zx in formula (3) include aliphatic chain-like and cyclic hydrocarbon groups as illustrated for Za1, and aromatic hydrocarbon groups such as benzene rings and crosslinking groups in the form of a benzene ring which is bondable to a silicon atom via a dimethylene chain.

In formula (2) wherein at least one r is 2 or 3, and at least one s is 1 or 2, formula (3) wherein at least two t's are 1 or 2, and formula (4) wherein at least one r is 2 or 3, very high heat resistance is expectable.

Examples of the hydrolyzable silane compounds of formulae (2) to (4) which are preferably used in dehydrolytic condensation to produce the silicon base polymer are given below.

Preferred examples of the hydrolyzable silane compound of formula (2) include 1,2-bis(methyldimethoxysilyl)ethane, 1-(methyldimethoxysilyl)-2-(dimethylmethoxysilyl)ethane, 1,3-bis(methyldimethoxysilyl)propane, 1-(methyldimethoxysilyl)-3-(dimethylmethoxysilyl)propane, 1,4-bis(methyldimethoxysilyl)butane, 1-(methyldimethoxysilyl)-4-(trimethoxysilyl)butane, 1,5-bis(methyldimethoxysilyl) pentane, 1-(methyldimethoxysilyl)-5-(trimethoxysilyl) pentane, 1,6-bis(methyldimethoxysilyl)hexane, 1-(methyldimethoxysilyl)-6-(trimethoxysilyl)hexane, and 1,6-bis(trimethoxysilyl)hexane.

Preferred examples of the hydrolyzable silane compound of formula (3) include 1,1,4,4-tetramethoxy-1,4-disilacyclohexane, 1,1,4-trimethoxy-4-methyl-1,4-disilacyclohexane, 1,1,4,4-tetraethoxy-1,4-disilacyclohexane, 1,1,4-triethoxy-4-methyl-1,4-disilacyclohexane, 1,1,3,3-tetramethoxy-1,3-disilacyclohexane, 1,1,3-trimethoxy-3-methyl-1,3-disilacyclohexane, 1,1,3,3-tetraethoxy-1,3-disilacyclohexane, 1,1,3-triethoxy-3-methyl-1,3-disilacyclohexane, 1,3,5-trimethoxy-1,3,5-trimethyl-1,3,5-trisilacyclohexane, 1,1,3,3,5,5-hexamethoxy-1,3,5-trisilacyclohexane, 1,3,5-triethoxy-1,3,5-trimethyl-1,3,5-trisilacyclohexane, 1,1,3,3,5,5-hexaethoxy-1,3,5-trisilacyclohexane, 1,3,5,7-tetramethoxy-1,3,5,7-tetramethyl-1,3,5,7-tetrasilacyclooctane, 1,3,5,7-tetraethoxy-1,3,5,7-tetramethyl-1,3,5,7-tetrasilacyclooctane, 1,3,5,7-tetramethoxy-1,3,5,7-tetraphenyl-1,3,5,7-tetrasilacyclooctane, and 1,3,5,7-tetraethoxy-1,3,5,7-tetraphenyl-1,3,5,7-tetrasilacyclooctane.

Preferred examples of the hydrolyzable silane compound of formula (4) include 1,3,5-tris(methyldimethoxysilyl)cyclohexane, 1,3,5-tris(dimethylmethoxysilyl)cyclohexane, 1,2-bis(methyldimethoxysilyl)benzene, 1,3-bis(methyldimethoxysilyl)benzene, 1,4-bis(methyldimethoxysilyl)benzene, 1,3,5-tris(methyldimethoxysilyl)benzene, 1,3,5-tris(dimethylmethoxysilyl)benzene, 1,2,4,5-tetrakis(dimethylmethoxysilyl)benzene, and modified forms of the foregoing compounds in which the methoxy is replaced by ethoxy, propoxy, butoxy and alkyl isomers thereof or hydrogen.

The silicon base polymer used in the bond layer attains the object of the invention as long as at least 90 mol % of silicon atoms in the polymer are silicon atoms having a direct bond to the crosslink composed of the aliphatic hydrocarbon group, the heterocycle-containing group or the aromatic ring-containing hydrocarbon group. A hydrolyzable silane having neither carbon crosslink nor bond or a condensable silane may be added to the condensate precursor mixture as long as this does not bring about a deviation from the intended design. Preferred examples of the hydrolyzable silane compound having neither carbon crosslink nor bond which can be used herein include silane compounds of the general formula (5):

$$SiR_{4-s}Y_s \qquad (5)$$

wherein s is each independently an integer of 2 to 4, Y is each independently a hydrolyzable group, and R is an optionally substituted, aliphatic or aromatic hydrocarbon group of 1 to 12 carbon atoms. Since this component is not the major reactant, R may be selected from a wide variety of groups within the above definition. Y is preferably hydrogen, hydroxyl, or alkoxy of 1 to 4 carbon atoms. Where it is desired to improve heat resistance, a compound of formula (5) wherein s is 3 or 4 is useful for the desired effect.

The condensate precursor mixture from which the silicon base polymer is prepared may further contain a boron, titanium, aluminum or another metal compound in addition to the aforementioned hydrolyzable or condensable silane compounds as long as the amount of such metal compound is up to 5 mol % as a ratio of metal atoms to silicon atoms.

The silicon base polymer may be produced through dehydrolytic condensation of the condensate precursor, specifically by providing a condensate precursor or a mixture thereof as defined above, and subjecting it to dehydrolytic condensation in the presence of an acid or basic catalyst. With respect to the dehydrolytic condensation of hydrolyzable silane compounds, a number of documents are known, for example, JP-A 2008-19423 (Patent Document 5), and any of the known methods may be used. A basic catalyst is preferably used in order to effect hydrolysis and condensation of Si—H bonds, although the condensation state may be controlled by designing the process such that Si—H bonds are reserved until the sintering step, and Si—H bonds are converted to Si—O—Si bonds during the sintering step. In the latter case, the process may be further designed such as to provide for reflow after film formation, with the advantage that a bond layer precursor coating having higher flatness can be formed.

In the embodiment wherein the acid catalyst is used, suitable catalysts include mineral acids such as hydrofluoric acid, hydrochloric acid, hydrobromic acid, sulfuric acid, nitric acid, perchloric acid, and phosphoric acid, sulfonic acid derivatives such as methanesulfonic acid, benzenesulfonic acid, toluenesulfonic acid and trifluoromethanesulfonic acid, and organic acids having a relatively high acidity such as oxalic acid and maleic acid. The catalyst is used in amounts of $10^{-6}$ to 10 moles, preferably $10^{-5}$ to 5 moles, and more preferably $10^{-4}$ to 1 mole per mole of silicon atoms in the silicon monomer or mixture thereof.

The amount of water added to the condensate precursor for allowing dehydrolytic condensation to occur to produce the silicon base polymer is 0.01 to 100 moles, preferably 0.05 to 50 moles, and more preferably 0.1 to 30 moles per mole of hydrolyzable substituent groups bonded to the condensate precursor. Adding more than 100 moles of water is uneconomical because the apparatus used for reaction must be extra large.

As to the reaction procedure, a condensate precursor is added to a catalyst aqueous solution whereupon dehydrolytic condensation starts. At this point, an organic solvent may be added to the catalyst aqueous solution and/or the condensate precursor may be diluted with an organic solvent. The reaction temperature may be in a range of 0 to 100° C., and preferably 5 to 80° C. In the preferred procedure, the condensate precursor is added dropwise at a temperature of 5 to 80° C. and the reaction solution is then matured at a temperature of 20 to 80° C.

Suitable organic solvents that can be added to the catalyst aqueous solution or used to dilute the condensate precursor include methanol, ethanol, 1-propanol, 2-propanol, 1-butanol, 2-butanol, 2-methyl-1-propanol, acetone, acetonitrile, tetrahydrofuran, toluene, hexane, ethyl acetate, cyclohexanone, methyl-2-n-amylketone, 4-methyl-2-pentanone, propylene glycol monomethyl ether, ethylene glycol monomethyl ether, propylene glycol monoethyl ether, ethylene glycol monoethyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, γ-butyrolactone, and mixtures thereof.

Of these solvents, water-soluble solvents are preferred. Examples include alcohols such as methanol, ethanol, 1-propanol and 2-propanol, polyhydric alcohols such as ethylene glycol and propylene glycol, condensed derivatives of polyhydric alcohols such as propylene glycol monomethyl ether, ethylene glycol monomethyl ether, propylene glycol monoethyl ether, ethylene glycol monoethyl ether, propylene glycol monopropyl ether, and ethylene glycol monopropyl ether, acetone, 4-methyl-2-pentanone, acetonitrile, and tetrahydrofuran. Of these, those solvents having a boiling point equal to or lower than 100° C. are more preferred.

The organic solvent is preferably used in an amount of 0 to 1000 ml, more preferably 0 to 500 ml per mole of the condensate precursor. An excess amount of the organic solvent is uneconomical because the apparatus used for reaction must be extra large.

In the other embodiment wherein the basic catalyst is used, suitable catalysts include methylamine, ethylamine, propylamine, butylamine, ethylenediamine, hexamethylenediamine, dimethylamine, diethylamine, ethylmethylamine, trimethylamine, triethylamine, tripropylamine, tributylamine, cyclohexylamine, dicyclohexylamine, monoethanolamine, diethanolamine, dimethyl monoethanolamine, monomethyl diethanolamine, triethanolamine, diazabicyclooctane, diazabicyclocyclononene, diazabicycloundecene, hexamethylene tetramine, aniline, N,N-dimethylaniline, pyridine, N,N-dimethylaminopyridine, pyrrole, piperazine, pyrrolidine, piperidine, picoline, tetramethylammonium hydroxide, choline hydroxide, tetrapropylammonium hydroxide, tetrabutylammonium hydroxide, ammonia, lithium hydroxide, sodium hydroxide, potassium hydroxide, barium hydroxide, and calcium hydroxide. The catalyst is used in amounts of $10^{-6}$ to 10 moles, preferably $10^{-5}$ to 5 moles, and more preferably $10^{-4}$ to 1 mole per mole of the condensate precursor.

The amount of water added to the condensate precursor for allowing dehydrolytic condensation to occur to produce the silicon base polymer is 0.01 to 100 moles, preferably 0.05 to 50 moles, and more preferably 0.1 to 30 moles per mole of hydrolyzable substituent groups bonded to the condensate precursor. Adding more than 100 moles of water is uneconomical because the apparatus used for reaction must be extra large.

As to the reaction procedure, a condensate precursor is added to a catalyst aqueous solution whereupon dehydrolytic condensation starts. At this point, an organic solvent may be added to the catalyst aqueous solution and/or the condensate precursor may be diluted with an organic solvent. The reaction temperature may be in a range of 0 to 100° C., and preferably 5 to 80° C. In the preferred procedure, the condensate precursor is added dropwise at a temperature of 5 to 80° C. and the reaction solution is then matured at a temperature of 20 to 80° C.

Suitable organic solvents that can be added to the catalyst aqueous solution or used to dilute the condensate precursor include methanol, ethanol, 1-propanol, 2-propanol, 1-butanol, 2-butanol, 2-methyl-1-propanol, acetone, acetonitrile, tetrahydrofuran, toluene, hexane, ethyl acetate, cyclohexanone, methyl-2-n-amylketone, propylene glycol monomethyl ether, ethylene glycol monomethyl ether, propylene glycol monoethyl ether, ethylene glycol monoethyl ether, propylene glycol dimethyl ether, ethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, γ-butyrolactone, and mixtures thereof.

Of these solvents, water-soluble solvents are preferred. Examples include alcohols such as methanol, ethanol, 1-propanol and 2-propanol, polyhydric alcohols such as ethylene glycol and propylene glycol, condensed derivatives of polyhydric alcohols such as propylene glycol monomethyl ether, ethylene glycol monomethyl ether, propylene glycol monoethyl ether, ethylene glycol monoethyl ether, propylene glycol monopropyl ether, and ethylene glycol monopropyl ether, acetone, acetonitrile, and tetrahydrofuran. Of these, those solvents having a boiling point equal to or lower than 100° C. are more preferred.

The organic solvent is preferably used in an amount of 0 to 1000 ml, more preferably 0 to 500 ml per mole of the condensate precursor. An excess amount of the organic solvent is uneconomical because the apparatus used for reaction must be extra large.

Thereafter, the catalyst is neutralized if necessary, and the alcohol formed during dehydrolytic condensation is removed under vacuum, yielding the reaction mixture in aqueous solution form. When the base is used as the catalyst, an acidic substance may be used for neutralization, preferably in an amount of 0.1 to 2 equivalents relative to the base. Any of acidic substances which exhibit acidity in water may be used for the neutralization purpose.

The silicon base polymer thus obtained may be dissolved in an organic solvent, which may contain water, to formulate a bond layer precursor coating-forming composition. Any organic solvents may be used as long as the solvent has an appropriate volatility under particular coating conditions and the silicon base polymer is dissolvable therein. Preferred examples of the solvent used herein include aliphatic hydrocarbon solvents such as n-pentane, isopentane, n-hexane, isohexane, n-heptane, 2,2,2-trimethylpentane, n-octane, isooctane, cyclohexane, and methylcyclohexane; aromatic hydrocarbon solvents such as benzene, toluene, xylene, ethylbenzene, trimethylbenzene, methylethylbenzene, n-propylbenzene, isopropylbenzene, diethylbenzene, isobutylbenzene, triethylbenzene, diisopropylbenzene, and n-amylnaphthalene;

ketone solvents such as acetone, methyl ethyl ketone, methyl n-propyl ketone, methyl n-butyl ketone, methyl isobutyl ketone, cyclopentanone, cyclohexanone, 2-hexanone, methylcyclohexanone, 2,4-pentanedione, acetonylacetone, diacetone alcohol, and acetophenone;

ether solvents such as ethyl ether, isopropyl ether, n-butyl ether, n-hexyl ether, 2-ethyl hexyl ether, dioxolane, 4-methyldioxolane, dioxane, dimethyldioxane, ethylene glycol mono-n-butyl ether, ethylene glycol mono-n-hexyl ether, ethylene glycol monophenyl ether, ethylene glycol mono-2-ethyl butyl ether, ethylene glycol dibutyl ether, diethylene glycol monomethyl ether, diethylene glycol dimethyl ether, diethylene glycol monoethyl ether, diethylene glycol diethyl ether, diethylene glycol monopropyl ether, diethylene glycol dipropyl ether, diethylene glycol monobutyl ether, diethylene glycol dibutyl ether, tetrahydrofuran, 2-methyltetrahydrofuran, propylene glycol monomethyl ether, propylene glycol dimethyl ether, propylene glycol monoethyl ether, propylene glycol diethyl ether, propylene glycol monopropyl ether, propylene glycol dipropyl ether, propylene glycol monobutyl ether, dipropylene glycol dimethyl ether, dipropylene glycol diethyl ether, dipropylene glycol dipropyl ether, and dipropylene glycol dibutyl ether;

ester solvents such as diethyl carbonate, ethyl acetate, γ-butyrolactone, γ-valerolactone, n-propyl acetate, isopropyl acetate, n-butyl acetate, isobutyl acetate, sec-butyl acetate, n-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, dipropylene glycol monomethyl ether acetate, dipropylene glycol monoethyl ether acetate, dipropylene glycol mono-n-butyl ether acetate, glycol diacetate, methoxytriglycol acetate, ethyl propionate, n-butyl propionate, isoamyl propionate, diethyl oxalate, di-n-butyl oxalate, methyl lactate, ethyl lactate, n-butyl lactate, n-amyl lactate, diethyl malonate, dimethyl phthalate, and diethyl phthalate;

nitrogen-containing solvents such as N-methylformamide, N,N-dimethylformamide, acetamide, N-methylacetamide, N,N-dimethylacetamide, N-methylpropionamide, and N-methylpyrrolidone; and sulfur-containing solvents such as dimethyl sulfide, diethyl sulfide, thiophene, tetrahydrothiophene, dimethyl sulfoxide, sulfolane, and 1,3-propanesultone. These solvents may be used alone or in admixture.

The solids concentration may be adjusted so as to provide an appropriate viscosity depending on a particular coating technique. Specifically, the solids concentration may be adjusted in accordance with the intended thickness of a bond layer precursor coating to form a bond and the physical properties of the silicon base polymer. In general, the solids concentration is 0.1 to 40% by weight, and preferably 0.2 to 30% by weight.

The silicon base polymer resulting from dehydrolytic condensation preferably has a degree of polymerization corresponding to a weight average molecular weight of 300 to 100,000, and more preferably 500 to 50,000 as measured by gel permeation chromatography (GPC) versus polystyrene standards.

If desired, auxiliary additives including stabilizers such as surfactants and pH modifiers, and cure accelerators such as photoacid generators and thermal acid generators may be added to the bond layer precursor coating-forming composition. These auxiliary additives are known from many documents, for example, JP-A 2008-19423 (Patent Document 5). In general, any such auxiliary additives may or may not be used.

To join a plurality of substrates together, the bond layer precursor coating is interposed between substrates to be joined and heat cured to form a bond. As opposed to ordinary silicone-base adhesives using crosslinkers, the cure reaction contemplated herein is a condensation reaction so that water or alcohol gas evolves upon curing.

Then, where the substrates to be joined together are substrates of a gas impermeable material, typically silicon wafers, it is preferred that cure reaction be continued for a fully long time, or a gas-permeable layer be formed on at least one of bonding surfaces to be joined.

While the bonding step of heat curing the bond layer precursor coating is accompanied by evolution of gas from the precursor coating as a result of reaction, the gas-permeable layer used herein is a layer which serves to release the gas out of the system. In general, the gas-permeable layer is a film containing pores which may be extremely fine. Such pores may be either mesopores having a diameter of 1 to 10 nm or micropores having a diameter of up to 1 nm. Suitable porous materials include CVD-low-k materials (e.g., WO 2005053009), coating type low-k materials (e.g., JP-A 2004-269693, JP-A 2007-324283, JP-A 2007-314778), SOG materials (e.g., U.S. Pat. No. 6,268,457), and coating type hard mask materials (e.g., JP-A 2008-19423). It is noted that oxide layers on Si surface and silicon oxide films deposited by conventional techniques such as TEOS-CVD are unsuitable as the gas-permeable layer.

The procedure of bonding substrates together includes providing substrates to be bonded, one or both of which may have a gas-permeable layer on the bonding surface if necessary, forming a bond layer precursor coating therebetween, and heat curing the precursor coating.

When the bond layer precursor coating is as thin as about 2 µm or less, such a thin bond layer precursor coating is preferably formed by coating the bond layer precursor coating-forming composition onto a bonding surface of one or both of substrates which are optionally provided with a gas-permeable layer. The coating technique may be any of well-known coating techniques. When wafers are bonded together, spin coating is preferred because a coating having a high flatness is readily formed.

When a bond layer precursor coating is formed by a coating technique, the bond layer precursor coating as coated may be directly subjected to a heat curing step to achieve a bond. However, to prevent the occurrence of voids or bond failures in bonding due to the evolution of noticeable gas upon curing, the bond layer precursor coating is preferably B-staged prior to the heat curing step, that is, crosslinking reaction has taken place between silicon base polymer molecules in the precursor coating.

B-staging conditions vary with the type of silicon base polymer, the type of solvent, and the presence or absence of cure promoter, and must be separately selected in accordance with particular materials used. As a standard measure, B-staging conditions may be selected so that 60 to 95 mol % of crosslink-forming side chains (silanol and alkoxy groups) become Si—O—Si bonds. Of these conditions, the heating temperature and time are adjusted while monitoring the tack of the bond layer precursor coating. Most often, a B-staged bond layer precursor coating is obtained by heating at 120 to 230° C. for 30 seconds to 3 minutes. These conditions must be adjusted as necessary because short-cure makes it difficult to maintain the uniformity of the coating during bonding and over-cure causes the coating to lose bond strength.

There has been described the embodiment using a bond layer precursor coating comprising a silicon base polymer which is designed in terms of a proportion of silicon atoms having a specific structure. Aside from the design based on a proportion of silicon atoms having a specific structure as discussed above, the bonding method of the invention is also successful when the silicon base polymer for use in the bond layer precursor coating-forming composition is designed so as to meet the following criterion.

In another embodiment, a bonding composition comprising a silicon base polymer as a thermosetting polymeric binder is designed such that the composition is heat curable at a temperature of up to 400° C. into a cured film which has a modulus of elasticity of up to 4 GPa and which experiences a weight loss of up to 3% upon heating at 400° C. and holding at 400° C. for 60 minutes.

The modulus of elasticity of a cured film may be determined by applying the bonding composition onto a suitable substrate to form a coating, heating the coating at a temperature sufficient to facilitate curing, thus obtaining a cured film, and measuring the modulus of elasticity of the film by a standard technique. For example, the bonding composition is applied onto a silicon wafer to form a precursor coating. The coating is heated at 100 to 200° C. for about one minute to evaporate off the excess solvent remaining in the coating. The coating is placed in a firing furnace and heated in a nitrogen atmosphere at 35° C. for 60 minutes whereby the precursor coating is heat cured, the cured film becoming a sample. The modulus of elasticity of this sample is measured by the nanoindentation technique. Using a material capable of forming a cured film having a modulus of elasticity of up to 4 GPa, a semiconductor device having stacked substrates joined via bonds (bond layers) which are unsusceptible to failure under stresses caused by subsequent thermal shocks and remain reliable can be fabricated.

The standard assay relating to weight loss is a technique capable of accurately measuring the weight of a film as deposited. Specifically, a precursor coating is similarly formed from the bonding composition and heat cured at a temperature equal to or less than 400° C. The weight of the cured film is accurately measured. Then the film is heated at 400° C. for 60 minutes, after which the weight of the film is accurately measured again. In this way a weight loss is determined.

This measurement may be performed using a TG/DTA (thermogravimetry/differential thermal analysis) system, for example. Specifically, a small volume of the bonding composition is dropped in an aluminum pan, which is heated on a hot plate at about 100 to 200° C. for evaporating off the excess solvent. The pan is mounted in the system, where the sample is heated at a ramp of 10° C./sec to 400° C. and held at 400° C. for 1 minute, after which the heater is shut off and the weight of the nonvolatile remaining in the pan is accurately measured. Then the sample is again heated at 400° C. and held at the temperature for one hour, after which a weight loss is accurately measured. During the procedure, the volume of the bonding composition dropped in the aluminum pan must be selected so that a film having an appropriate thickness of about 1 μm may be formed, because a larger volume forms a thicker film from which the solvent may not be effectively evaporated off under the above-described heating conditions.

The measurement of a weight loss may be performed by any of techniques capable of accurately measuring the weight of a heat cured film. In an alternative procedure, the bonding composition is applied onto a fluororesin-coated surface of a substrate and heat cured thereon into a cured film, after which the cured film is stripped and used in the weight loss test.

As long as the weight loss is equal to or less than 3%, an assembly of substrates joined via such a bond layer is unsusceptible to bond failures by heat even when the subsequent process involves a CVD step where heat of about 400° C. is applicable. Then the processing technique which is employed subsequent to the bonding step can be selected from a wider range.

The important candidates for the silicon base polymer which is used to formulate the composition for forming the bond layer precursor coating include polymers obtained from dehydrolytic condensation of a mixture comprising hydrocarbon-crosslinked polynuclear hydrolyzable silanes alone or in admixture including hydrolyzable silane compounds of the general formulae (2) to (4) as a main component and optionally, a hydrolyzable silane of the general formula (5) and other compounds.

As described previously, it is preferred that the bond layer precursor coating be B-staged during formation, and when substrates to be joined are less gas permeable, a gas-permeable layer be formed on a bonding surface of substrate.

The final bonding step may be performed as follows. An optionally B-staged bond layer precursor coating is interposed between substrates to be joined which are optionally provided with a gas-permeable layer. The assembly of precursor coating between substrates is joined under pressure and then heated, preferably while evacuating the atmosphere, whereby the precursor coating is heat cured into a bond layer.

Better results of heat curing are obtained as the vacuum of the atmosphere is lower. Usually the atmosphere has a vacuum of 500 to 5,000 Pa. During the heat curing, the substrates are preferably held in close contact, for example, by applying a load of 1,000 to 60,000 N to the assembly. The heating temperature for curing to complete a bond depends on the type of materials involved and auxiliary additives, if any, and the assembly is usually heated at 200 to 450° C. for 1 to 120 minutes.

Example

Examples of the invention are given below by way of illustration and not by way of limitation.

Synthesis Example 1

Synthesis of BSE-34 Resin by Sedimentation

With stirring at room temperature, a solution of 51.1 g of 1,2-bis(methyldimethoxysilyl)ethane and 47.6 g of 1-(methyldimethoxysilyl)-2-(dimethylmethoxysilyl)ethane in 13 g of 4-methyl-2-pentanone was added to a solution of 0.16 g of conc. nitric acid in 223 g of ultrapure water. The reaction solution gradually liberated heat and reached 50° C., but resumed room temperature after 30 minutes. Stirring was continued in this state for 12 hours. Then 300 g of propylene glycol monomethyl ether acetate (PGMEA) was added to the reaction solution whereupon using an evaporator, the low-boiling solvent was distilled off under subatmospheric pressure. During the step, the evaporator was kept in a bath at a temperature below 30° C. To the residual solution were added 500 ml of ethyl acetate and 500 ml of ultrapure water. This was transferred to a separatory funnel, from which the water layer was removed. The organic layer was washed twice with 200 ml of ultrapure water. To the organic layer was added 300 g of PGMEA. Using an evaporator, the solvent was distilled off, yielding 210 g of the solution, which is a bonding composition mother liquid. This solution had a nonvolatile content of 14.7% by weight and a weight average molecular weight of 1,952 as measured by gel permeation chromatography (GPC).

Synthesis Example 2

A bonding composition mother liquid was obtained by the same procedure as in Synthesis Example 1 except that the mixture of 51.1 g of 1,2-bis(methyldimethoxysilyl)ethane and 47.6 g of 1-(methyldimethoxysilyl)-2-(dimethylmethoxysilyl)-ethane in Synthesis Example 1 was replaced by 102.2 g of 1,2-bis(methyldimethoxysilyl)ethane. This solution had a nonvolatile content of 20.4% by weight and a weight average molecular weight of 2,092 as measured by GPC.

Synthesis Example 3

A bonding composition mother liquid was obtained by the same procedure as in Synthesis Example 1 except that the mixture of 51.1 g of 1,2-bis(methyldimethoxysilyl)ethane and 47.6 g of 1-(methyldimethoxysilyl)-2-(dimethylmethoxysilyl)-ethane in Synthesis Example 1 was replaced by a mixture of 146.0 g (0.41 mol) of bis[2-(methyldimethoxysilyl)ethyl]-dimethoxysilane and 13.6 g (0.1 mol) of methyltrimethoxysilane. This solution had a nonvolatile content of 16.2% by weight and a weight average molecular weight of 2,764 as measured by GPC.

Synthesis Example 4

A bonding composition mother liquid was obtained by the same procedure as in Synthesis Example 1 except that the mixture of 51.1 g of 1,2-bis(methyldimethoxysilyl)ethane and 47.6 g of 1-(methyldimethoxysilyl)-2-(dimethylmethoxysilyl)-ethane in Synthesis Example 1 was replaced by a mixture of 71.4 g (0.3 mol) of 1,2-bis(methyldimethoxysilyl)ethane and 19.8 g (0.075 mol) of 1,3,5-trimethoxy-1,3,5- trisilacyclo-hexane. This solution had a nonvolatile content of 18.2% by weight and a weight average molecular weight of 2,966 as measured by GPC.

Synthesis Example 5

A bonding composition mother liquid was obtained by the same procedure as in Synthesis Example 1 except that the mixture of 51.1 g of 1,2-bis(methyldimethoxysilyl)ethane and 47.6 g of 1-(methyldimethoxysilyl)-2-(dimethylmethoxysilyl)-ethane in Synthesis Example 1 was replaced by a mixture of 71.4 g (0.3 mol) of 1,2-bis(methyldimethoxysilyl) ethane and 29.6 g (0.075 mol) of tris(2-methoxydimethylsilylethyl)-methylsilane. This solution had a nonvolatile content of 15.2% by weight and a weight average molecular weight of 3,042 as measured by GPC.

Comparative Synthesis Example 1

Synthesis of Bond Layer Composition

A bonding composition mother liquid was obtained by the same procedure as in Synthesis Example 1 except that the mixture of 51.1 g of 1,2-bis(methyldimethoxysilyl)ethane and 47.6 g of 1-(methyldimethoxysilyl)-2-(dimethylmethoxysilyl)-ethane in Synthesis Example 1 was replaced by 116.7 g of methyltrimethoxysilane. This solution had a nonvolatile content of 20.8% by weight and a weight average molecular weight of 2,062 as measured by GPC.

Comparative Synthesis Example 2

A bonding composition mother liquid was obtained by the same procedure as in Synthesis Example 1 except that the mixture of 51.1 g of 1,2-bis(methyldimethoxysilyl)ethane and 47.6 g of 1-(methyldimethoxysilyl)-2-(dimethylmethoxysilyl)-ethane in Synthesis Example 1 was replaced by a mixture of 58.6 g (0.43 mol) of methyltrimethoxysilane and 51.7 g (0.43 mol) of dimethyldimethoxysilane. This solution had a nonvolatile content of 22.2% by weight and a weight average molecular weight of 1,064 as measured by GPC.

Preparation Example 1

Provision of Silicon Wafer with Gas-Permeable Film

With stirring, a solution of 188.4 g of ethanol, 93.44 g of ultrapure water, and 8.26 g of 25% tetramethylammonium hydroxide was heated at 60° C. To this solution, a mixture of 19.5 g of methyltrimethoxysilane and 36.43 g of tetraethoxysilane was added dropwise over 6 hours. The resulting reaction solution was cooled in an ice water bath to room temperature, after which 2 g of oxalic acid and 200 ml of PGMEA were added thereto. From the resulting solution, the solvent was distilled off on an evaporator until the residual liquid was 161 g. To the residual liquid were added 200 g of ethyl acetate and 120 g of ultrapure water. Using a separatory funnel, the resulting liquid was washed and kept stationary. After the water layer was removed, the organic layer was further washed twice with 120 ml of ultrapure water. To the organic layer was added 120 ml of PGMEA. On an evaporator, the solvent was distilled off, yielding 208 g of the concentrated solution, which is a gas-permeable film-forming composition mother liquid. This solution had a nonvolatile content of 21.3% by weight.

The mother liquid was spin coated onto a silicon wafer at a rotational speed of 1500 rpm, baked at 120° C. for 2 minutes and at 230° C. for 2 minutes, and heated at 425° C. for one hour, forming a gas-permeable film having a thickness of about 100 nm.

Example 1

Onto the silicon wafer having the gas-permeable film coated thereon, the bonding composition of Synthesis Example 1 was spin coated at a rotational speed of 1500 rpm and heated on a hot plate at 100° C. for 1 minute for evaporating off the solvent, yielding a substrate ready for bonding. The bond layer precursor coating had a thickness of about 500 nm. Two substrates were mated with the precursor coatings inside and set in a semi-automated wafer bonding system EVG520 (EV Group). The assembly was joined under a vacuum of 10 mbar at 150° C., heated to 300° C. at a ramp of 10° C./min while applying a pressure of 5 kN, held at the temperature for 2 minutes, and then cooled to 150° C. at the same rate.

The sample as bonded was measured for bond strength by a razor test, finding a bond strength of about 3 J/m$^2$. Using a scanning acoustic tomograph FS300II (Hitachi Construction Machinery Co., Ltd.), the bond interface was observed, finding neither peels nor defects. The bond interface was confirmed sound.

Examples 2 to 5

A bond strength test was conducted by the same procedure as in Example 1 aside from using the bonding compositions of Synthesis Examples 2 to 5. The samples had a bond strength of about 2, 3, 1.5, and 1.5 J/m$^2$, respectively. The bond interfaces were observed to contain neither peels nor defects and thus confirmed sound.

Comparative Examples 1 and 2

A bond strength test was conducted by the same procedure as in Example 1 aside from using the bonding compositions of Comparative Synthesis Examples 1 and 2. The samples had a bond strength of about 0.5 and 1.5 J/m$^2$, respectively. The bond interfaces were observed to contain peels and defects and thus confirmed unsound.

In Comparative Example 1, the bond layer formed had a very high modulus of elasticity as shown below, allowing the bond interface to be damaged by thermal expansion and contraction of substrates before and after the bonding step. In Comparative Example 2, part of the bond layer underwent thermal decomposition during the bonding step, causing a bond interface failure.

Examples 6 to 10 and Comparative Examples 3 and 4

Measurement of Modulus of Elasticity

A modulus of elasticity was measured by coating each of the bonding compositions of Synthesis Examples 1 to 5 and Comparative Synthesis Examples 1 and 2 onto a silicon wafer, firing at 400° C. for 1 hour to form a film of about 500 nm thick, and analyzing the film on a thin-film mechanical properties evaluating system Nano Indenter SA2 (MTS Nano Instruments). The results are shown in Table 1.

TABLE 1

|  | Bonding composition | Modulus of elasticity | Hardness |
| --- | --- | --- | --- |
| Example 6 | Synthesis Example 1 | 1.84 | 0.10 |
| Example 7 | Synthesis Example 2 | 2.29 | 0.22 |
| Example 8 | Synthesis Example 3 | 2.06 | 1.16 |
| Example 9 | Synthesis Example 4 | 1.74 | 0.073 |
| Example 10 | Synthesis Example 5 | 1.67 | 0.073 |
| Comparative Example 3 | Comparative Synthesis Example 1 | 4.17 | 0.61 |
| Comparative Example 4 | Comparative Synthesis Example 2 | 0.76 | 0.060 |

As seen from Table 1, the samples of Examples and of Comparative Example 4 using the silicon oxide base polymer of Comparative Synthesis Example 2 containing a multiplicity of linear (dialkyl-substituted Si)—O-(dialkyl-substituted Si) continuous chains show a low modulus of elasticity, whereas the sample of Comparative Example 3 using the silicon oxide base polymer of Comparative Synthesis Example 1 in which silicon atoms have solely three or more oxygen atom crosslinks shows a high modulus of elasticity.

Examples 11 to 15 and Comparative Examples 5 and 6

Measurement of Weight Loss

A weight loss was determined by setting a sample in Thermo Flex TAS300 TG8101D (Rigaku Co., Ltd.) in a nitrogen stream, heating at 400° C., measuring a weight (assumed to be 100%) immediately thereafter, and holding at 400° C. for 1 hour, and measuring a weight again. The results are shown in Table 2.

TABLE 2

|  | Bonding composition | Weight loss @400° C./60 min |
| --- | --- | --- |
| Example 11 | Synthesis Example 1 | 1.2% |
| Example 12 | Synthesis Example 2 | 0.0% |
| Example 13 | Synthesis Example 3 | 0.5% |
| Example 14 | Synthesis Example 4 | 1.5% |
| Example 15 | Synthesis Example 5 | 1.6% |
| Comparative Example 5 | Comparative Synthesis Example 1 | 0.0% |
| Comparative Example 6 | Comparative Synthesis Example 2 | 3.2% |

As seen from Table 2, the samples of Examples and of Comparative Example 5 using the silicon oxide base polymer of Comparative Synthesis Example 1 in which silicon atoms have solely three or more oxygen atom crosslinks show a low weight loss of less than 3% whereas the sample of Comparative Example 6 using the silicon oxide base polymer of Comparative Synthesis Example 2 containing a multiplicity of linear (dialkyl-substituted Si)—O-(dialkyl-substituted Si) continuous chains show a weight loss of more than 3% due to thermal decomposition.

Japanese Patent Application No. 2008-209197 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A method of bonding substrates, comprising the steps of:
applying a high-temperature bonding composition to a substrate to form a bond layer precursor coating,
joining another substrate to the one substrate so as to sandwich the bond layer precursor coating therebetween, and
heat curing the bond layer precursor coating to bond the substrates together,
the high-temperature bonding composition comprising a silicon base polymer as a thermosetting binder, wherein said silicon base polymer is obtained from dehydrolytic condensation of a condensate precursor or a mixture thereof, said condensate precursor comprising a silane compound having at least one pair of silicon atoms tied by a crosslink composed of an optionally cyclic structure-containing straight or branched, or cyclic aliphatic hydrocarbon group of 1 to 10 carbon atoms, a heterocycle-containing group of 4 or 8 carbon atoms, or an aromatic ring-containing hydrocarbon group of 6 to 12 carbon atoms, the silane compound having at least three hydroxyl groups and/or hydrolyzable groups, and
those silicon atoms having a direct bond to the crosslink composed of the aliphatic hydrocarbon group, the heterocycle-containing group or the aromatic ring-containing hydrocarbon group are present in a proportion of at least 90 mol % relative to all silicon atoms in said silicon base polymer.

2. The substrate bonding method of claim 1 wherein the substrates to be bonded are used in the manufacture of semiconductor devices.

* * * * *